(12) United States Patent
El-Essawy et al.

(10) Patent No.: US 9,310,397 B2
(45) Date of Patent: Apr. 12, 2016

(54) MULTI-BRANCH CURRENT/VOLTAGE SENSOR ARRAY

(71) Applicant: INTERNATIONAL BUSINESS MACHINES CORPORATION, Armonk, NY (US)

(72) Inventors: Wael El-Essawy, Austin, TX (US); Alexandre Peixoto Ferreira, Austin, TX (US); Thomas Walter Keller, Austin, TX (US); Karthick Rajamani, Austin, TX (US); Juan C. Rubio, Austin, TX (US); Michael A. Schappert, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 402 days.

(21) Appl. No.: 13/752,668

(22) Filed: Jan. 29, 2013

(65) Prior Publication Data

US 2014/0210453 A1    Jul. 31, 2014

(51) Int. Cl.
*G01R 19/00* (2006.01)
*G01R 15/14* (2006.01)
*G01R 15/18* (2006.01)

(52) U.S. Cl.
CPC ............ *G01R 15/142* (2013.01); *G01R 15/183* (2013.01)

(58) Field of Classification Search
CPC .... G01R 15/42; G01R 15/183; G01R 15/207; G01R 21/06; G01R 15/202; G01R 19/2513; G01R 21/006; G01R 22/00; G01R 15/186; G01R 19/0092; G01R 15/14; G01R 15/146; G01R 19/0094; Y04S 20/242; Y04S 20/14; Y04S 20/32; Y04S 20/38; Y04S 20/46

USPC ...... 324/117 R, 117 H, 126–127, 142, 103 R, 324/251–252, 76.11, 522, 713, 348; 340/870.01–870.03; 702/60, 62, 702/64–65, 38
See application file for complete search history.

(56) References Cited

U.S. PATENT DOCUMENTS 4,005,380 A    1/1977    Heilmann et al.
4,266,189 A    5/1981    Karlin et al.
(Continued)

FOREIGN PATENT DOCUMENTS

CN    101329370 A    12/2008
CN    201654106 U    11/2010
(Continued)

OTHER PUBLICATIONS

Clarke, John, "Current Clamp Meter Adapter for DMMs", Silicon Chip, issue 180, published Sep. 12, 2003, 9 pages (pp. 1-9 in pdf).
(Continued)

*Primary Examiner* — Arleen M Vazquez
*Assistant Examiner* — Lee Rodak
(74) *Attorney, Agent, or Firm* — Mitch Harris, Atty at Law, LLC; Andrew M. Harris; William J. Stock

(57) ABSTRACT

A sensor array including multiple current sensors provides input for power measurement and management systems. The sensor array includes split ferrite cylinder portions connected by a frame, so that when the array is installed around multiple branch circuits in a power distribution panel or raceway, the ferrite cylinders are completed to surround the conductor(s) of the associated branch circuit. Voltage sensing may also be incorporated within the sensors by providing an electrically conductive plate, wire or other element that capacitively couples to the corresponding wire(s).

13 Claims, 8 Drawing Sheets

(56) References Cited

U.S. PATENT DOCUMENTS

| | | | |
|---|---|---|---|
| 4,378,525 A | 3/1983 | Burdick | |
| 4,558,276 A | 12/1985 | Comeau et al. | |
| 5,473,244 A | 12/1995 | Libove et al. | |
| 5,610,512 A | 3/1997 | Selcuk | |
| 5,867,020 A | 2/1999 | Moore et al. | |
| 6,008,634 A | 12/1999 | Murofushi et al. | |
| 6,414,474 B1 | 7/2002 | Gohara et al. | |
| 6,522,509 B1 | 2/2003 | Engel et al. | |
| 6,654,219 B1 | 11/2003 | Romano et al. | |
| 6,661,239 B1 | 12/2003 | Ozick | |
| 6,703,842 B2 | 3/2004 | Itimura et al. | |
| 6,708,126 B2 | 3/2004 | Culler et al. | |
| 6,825,649 B2 | 11/2004 | Nakano | |
| 6,940,291 B1 | 9/2005 | Ozick | |
| 7,068,045 B2 | 6/2006 | Zuercher et al. | |
| 7,098,644 B1 | 8/2006 | Denison | |
| 7,148,675 B2 | 12/2006 | Itoh | |
| 7,227,348 B2 | 6/2007 | Sorenson | |
| 7,230,413 B2 | 6/2007 | Zhang et al. | |
| 7,265,533 B2 * | 9/2007 | Lightbody et al. | 324/126 |
| 7,315,161 B2 | 1/2008 | Zribi et al. | |
| 7,330,022 B2 | 2/2008 | Bowman et al. | |
| 7,474,088 B2 | 1/2009 | Bowman et al. | |
| 7,493,222 B2 | 2/2009 | Bruno | |
| 7,546,214 B2 | 6/2009 | Rivers, Jr. et al. | |
| 7,622,912 B1 | 11/2009 | Adams et al. | |
| 7,714,594 B2 | 5/2010 | Ibuki et al. | |
| 7,719,257 B2 | 5/2010 | Robarge et al. | |
| 7,719,258 B2 | 5/2010 | Chen et al. | |
| 7,847,543 B2 | 12/2010 | Grno | |
| 7,936,164 B2 | 5/2011 | Doogue et al. | |
| 7,990,133 B2 | 8/2011 | Dockweiler | |
| 2004/0227503 A1 | 11/2004 | Bowman | |
| 2004/0257061 A1 | 12/2004 | George de Buda | |
| 2005/0156587 A1 | 7/2005 | Yakymyshyn et al. | |
| 2006/0087777 A1 * | 4/2006 | Bruno | 361/38 |
| 2007/0058304 A1 | 3/2007 | Parker et al. | |
| 2008/0077336 A1 | 3/2008 | Fernandes | |
| 2008/0079437 A1 | 4/2008 | Robarge et al. | |
| 2009/0105973 A1 | 4/2009 | Choi et al. | |
| 2010/0001715 A1 * | 1/2010 | Doogue et al. | 324/117 H |
| 2010/0198535 A1 | 8/2010 | Brown et al. | |
| 2010/0231198 A1 | 9/2010 | Bose et al. | |
| 2010/0264944 A1 | 10/2010 | Rupert | |
| 2010/0271037 A1 | 10/2010 | Blakely | |
| 2010/0283487 A1 | 11/2010 | Juds et al. | |
| 2011/0084688 A1 | 4/2011 | Sorensen | |
| 2012/0078680 A1 * | 3/2012 | Tharp | 705/7.28 |
| 2012/0200285 A1 | 8/2012 | Carpenter et al. | |
| 2012/0200291 A1 | 8/2012 | Carpenter et al. | |
| 2012/0200293 A1 | 8/2012 | Carpenter et al. | |
| 2012/0203481 A1 | 8/2012 | Carpenter et al. | |
| 2012/0319674 A1 | 12/2012 | El-Essawy et al. | |
| 2012/0319676 A1 | 12/2012 | El-Essawy et al. | |
| 2013/0099775 A1 | 4/2013 | Mitsuya | |
| 2014/0167787 A1 * | 6/2014 | Sanchez et al. | 324/654 |

FOREIGN PATENT DOCUMENTS

| | | |
|---|---|---|
| JP | 06174753 A | 6/1994 |
| JP | H09281146 A | 10/1997 |
| TW | M386680 | 8/2010 |
| WO | WO2009042414 A2 | 4/2009 |

OTHER PUBLICATIONS

McKenzie, et al. "Non-contact Voltage Measurement using Electronically Varying Capacitance", Electronics Letters, Feb. 4, 2010, 2 pages (pp. 1-2 in pdf), vol. 46, No. 3, UK.

"AC Current sensor with Interface" downloaded from: http://www.electronicspoint.com/ac-current-sensor-interface-t221239.html on Jun. 10, 2011, 4 pages (pp. 1-4 in pdf).

"Smart Current Signature Sensor" downloaded from http://technology.ksc.nasa.gov/successes/SS-Smart-Current-Signal-Snsr.htm on Jun. 10, 2011, 2 pages (pp. 1-2 in pdf).

Dwyer, Daniel, "A Self-Calibrating Miniature Hall Effect Solution to Gear Tooth Speed Sensing", downloaded from: http://saba.kntu.ac.ir/eecd/ecourses/instrumentation/projects/reports/speed/toothed%20rotor/toothrotor_files/main.htm on May 25, 2011, 10 pages (pp. 1-10 in pdf).

Valuetesters.com on-line catalog: "non-contact voltage probes", downloaded from http://valuetesters.com/Voltage-Probe-Non-contact.php on May 25, 2011, 5 pages (pp. 1-5 in pdf).

U.S. Appl. No. 13/682,112, filed Nov. 20, 2012, Carpenter, et al.

U.S. Appl. No. 13/596,658, filed Aug. 28, 2012, El-Essawy, et al.

Silicon Chip, "Compact 0-80A Automotive Ammeter", issue 165, pp. 1-12, downloaded from www.siliconchip.com.au/cms/A 03551/article.html Nov. 4, 2010, published Jun. 30, 2002.

Silicon Chip, "Current Clamp Meter Adapter for DMMs", issue 180, published Sep. 12, 2003.

Ziegler, et al., "Current Sensing Techniques: A Review", IEEE Sensors Journal, Apr. 2009, pp. 354-376 vol. 9, No. 4. Piscataway, NJ.

McKenzie, et al. "Non-contact Voltage Measurement using Electronically Varying Capacitance", Electronics Letters, Feb. 4, 2010, vol. 46, No. 3, UK.

"AC Current sensor with Interface" downloaded from: http://www.electronicspoint.com/ac-current-sensor-interface-t221239.html on Jun. 10, 2011.

"Smart Current Signature Sensor" downloaded from http://technology.ksc.nasa.gov/successes/SS-Smart-Current-Signal-Snsr.htm on Jun. 10, 2011.

Dwyer, "A Self-Calibrating Miniature Hall Effect Solution to Gear Tooth Speed Sensing", downloaded from: http://saba.kntu.ac.ir/eecd/ecourses/instrumentation/projects/reports/speed/toothed%20rotor/toothrotor_files/main.htm on May 24, 2011.

Valuetesters.com on-line catalog: "non-contact voltage probes", downloaded from http://valuetesters.com/Voltage-Probe-Non-contact.php on May 24, 2011.

* cited by examiner

MULTI-BRANCH CURRENT/VOLTAGE SENSOR ARRAY

BACKGROUND OF THE INVENTION

1. Field of the Invention

The present invention is related to wire managers for managing the position of one or multiple electrical wires, and more specifically to a multi-branch current sensor array with optional voltage sensing.

2. Description of Related Art

A need to measure power consumption in AC line powered systems is increasing due to a focus on energy efficiency for both commercial and residential locations. In order to measure power consumption of a circuit, the current drawn by the load must generally be measured, and for precise results, the characteristics of the load may also need to be known.

Adding current sensors to a power distribution system occupies space and adds complexity. If a large number of circuits must be measured, the installation difficulties are increased and the installation of the current sensor may cause disarray in the power distribution system.

It is also necessary to provide a safe environment for electrical workers and other personnel in the vicinity of the installations where power is being measured, because installation may be required in an electrical panel that is operational. Installation of current sensors in a live panel requires the use of insulating gloves that make it difficult to perform fine work with the fingers.

Therefore, it would be desirable to provide a current-sensing device that can provide isolated current draw information and optionally permit load characteristics to be taken into account, while providing safe and efficient installation with little additional space requirements within the power distribution system. It would further be desirable to provide such a device that is easy to operate while an installer is wearing insulating gloves.

BRIEF SUMMARY OF THE INVENTION

The invention is embodied in a current sensor for sensing currents passing through wires of multiple branch circuits and a method of operation.

The sensor has a first frame member and a second frame member in which are integrated corresponding portions of ferrite cylinders of the current sensors that, when the frame members are fastened together in a closed position, encircle the corresponding wire(s) of the branch circuit(s) associated with the individual sensors. The frame members may be separate, or may provide a sliding assembly that has an open and closed position for inserting and then retaining the wires, respectively. Measurement and communications electronics may be included in the first and/or second frame member to provide an efficient wireless or wired interconnect to other systems. Branch voltage sensing may be optionally integrated in the sensors, as well.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention encompasses current sensors for multiple branch circuits, which optionally include voltage sensors and other features for providing input to power measurement systems. For example, the present invention can provide input to power monitoring equipment in computer server rooms, in which multiple branch circuits distribute power to various electronic chassis power supplies, and in which it is beneficial to provide power usage information for the various branch circuits to power monitoring and/or system control utilities within a computer operating environment. Other applications include power monitoring for commercial and/or residential energy management.

Figure 1A:
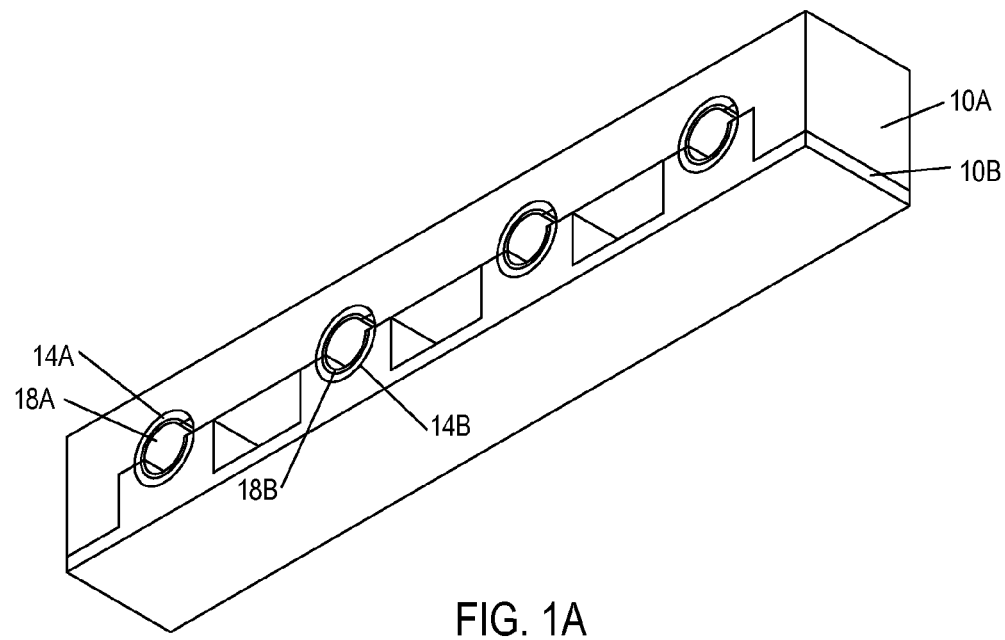
FIG. 1A is an isometric view.
Figure 1B:
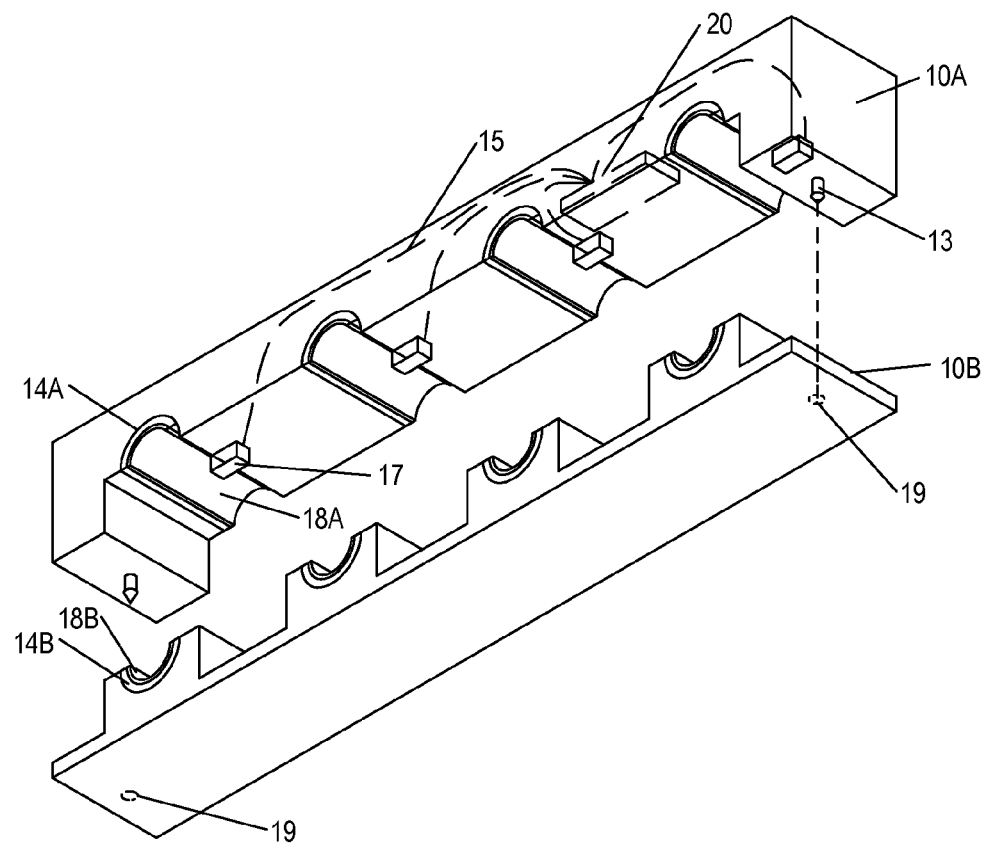
FIG. 1B is an exploded isometric view, of a multi-branch current-sensing device in accordance with an embodiment of the present invention.

Referring now to FIG. 1A and FIG. 1B, a current-sensing device in accordance with an embodiment of the invention is shown. FIG. 1B shows an exploded view with details of current sensors formed by ferrite cylinder portions 14A and 14B integrated in respective frame members 10A and 10B. As illustrated in FIG. 1A, when frame members 10A and 10B are snapped together, they form a current-sensing and voltage-sensing device for measuring the current passing through, and the electrical potentials on, a plurality of wires that generally correspond to multiple branch circuits of a power distribution panel. For the purposes of measuring branch circuit current and voltage within a power distribution panel, the spacing of the current sensors formed by ferrite cylinder portions 14A and 14B is generally one inch, which is a standard circuit breaker terminal spacing. Alternatively, other spacings may be provided, such as one-half inch spacing for split breaker applications and two-inch spacing for high current/high voltage applications in which the breaker spacing is larger. Further, the above dimensions correspond to standardized U.S. breaker panels, and spacings may be adapted to accommodate standardized breaker spacings for the countries in which a particular design of the device is intended for use. Frame members 10A, 10B are generally non-conductive plastic materials, but may be made from alternative materials, depending on requirements.

The voltage-sensing elements mentioned above are provided by metal foils or metal layers 18A and 18B adhered to or deposited within the central cylindrical voids formed by ferrite cylinder portions 14A and 14B when frame members 10A and 10B are snapped together in the closed position as illustrated in FIG. 1A. The illustrated current-sensing devices are provided by semiconductor current sensors 17 disposed within a gap formed between ferrite cylinder portions 14A and 14B when frame members 10A and 10B are snapped together in the closed position. The high-permeability magnetic flux path around one of the branch circuit wires (not shown) inserted through the central void through a corresponding pair of ferrite cylinder portions 14A and 14B is interrupted by the gap and concentrates the field at the corresponding one of current sensors 17 for measurement. A retaining pin 13 or other clip feature on frame member 10A mates with a mating recess 19 or other suitable feature on frame member 10B, in order to secure frame members 10A and 10B together after installation. An integrated circuit assembly 20 receives electrical connections 15 from current sensors 17 and voltage-sensing elements 18A and/or 18B, and can provide a wireless interface to an external power monitoring system. Power for operating integrated circuit assembly 20 can be obtained from a battery integrated within integrated circuit assembly 20. Alternatively, power can be obtained from a current-sensing winding that provides an alternative type of current sensor as described in further detail below, and which draws power from a branch circuit to which the current-sensing device is coupled.

Figure 2A:
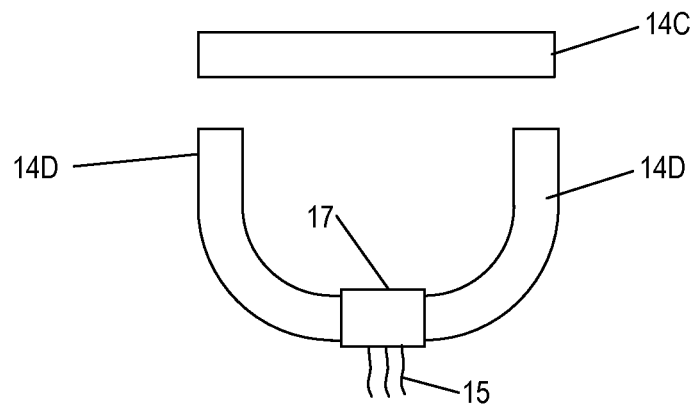
FIGS. 2A-2B are illustrations showing details of current-sensing elements that can be used in the multi-branch current sensor of FIGS. 1A-1B.

Referring to FIG. 2A, an alternative form of current sensor is shown that can provide for a lower-profile form of frame member 10B in FIGS. 1A-1B. In particular, when frame member 10B is affixed to a power panel and thus acts as a base of the current-sensing device, having a thin structure facilitates the insertion of frame member 10B behind existing branch circuit wires. To provide a thin structure, the ferrite cylinder halves providing ferrite cylinder portions 14A, 14B in FIGS. 1A-1B can be replaced by a flat ferrite piece 14C integrated in base frame member 10B and a U-shaped structure provided by ferrite cylinder portions 14D. Current sensor 17 is embedded in frame member 10A and wires 15 are also generally embedded in frame member 10A and routed to integrated circuit assembly 20. While FIG. 2A illustrates a current sensor formed from three ferrite portions, a current sensor can be formed by placing sensor 17 at one end of the U-shaped ferrite portion 14D in a manner similar to that illustrated in FIG. 1B. Alternatively, U-shaped ferrite portion 14D can be replaced by a half-cylinder with a sensor disposed at an end, such as ferrite cylinder portion 14A illustrated in FIG. 1B.

Figure 2B:
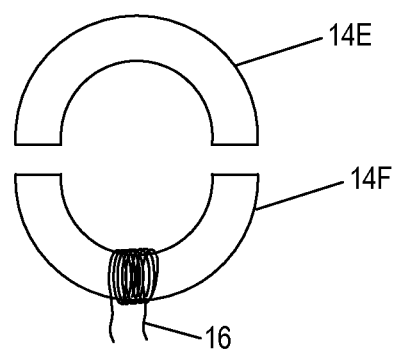

Referring to FIG. 2B, another alternative form of current sensor is shown that can provide a lower-cost device and optionally provide power for operating integrated circuit assembly 20. The current sensor of FIG. 2B uses a winding 16 disposed around ferrite cylinder portion 14F rather than using a gap and semiconductor current sensor as illustrated above. The ends of winding 16 can be routed within frame member 10A to integrated circuit assembly 20. Another ferrite cylinder portion 14E provides the remainder of the magnetic flux loop, which only requires such gaps as are made by the separate ferrite cylinder portions 14E and 14F, since a gap is not required for a semiconductor current sensor.

Figure 3A:
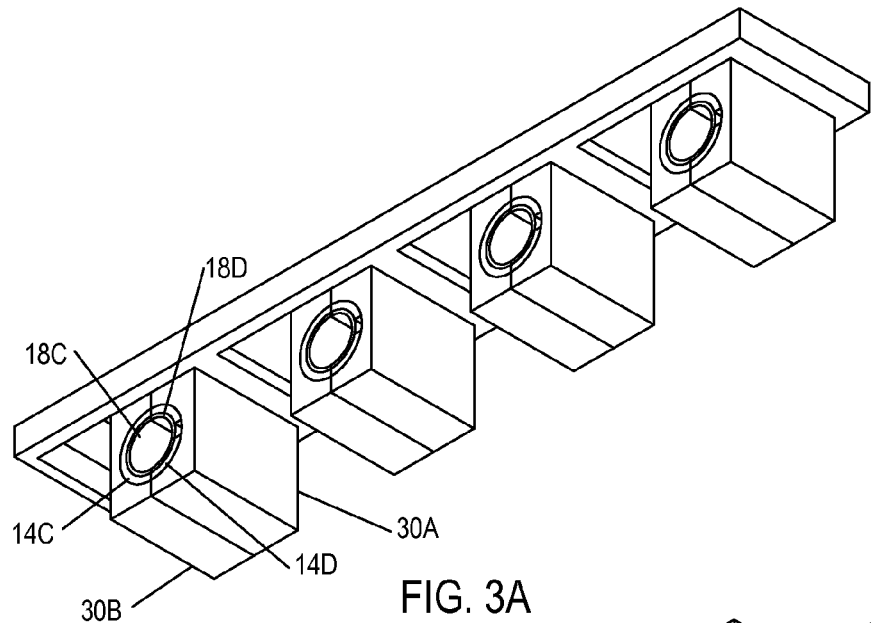
FIG. 3A is an isometric view.
Figure 3B:
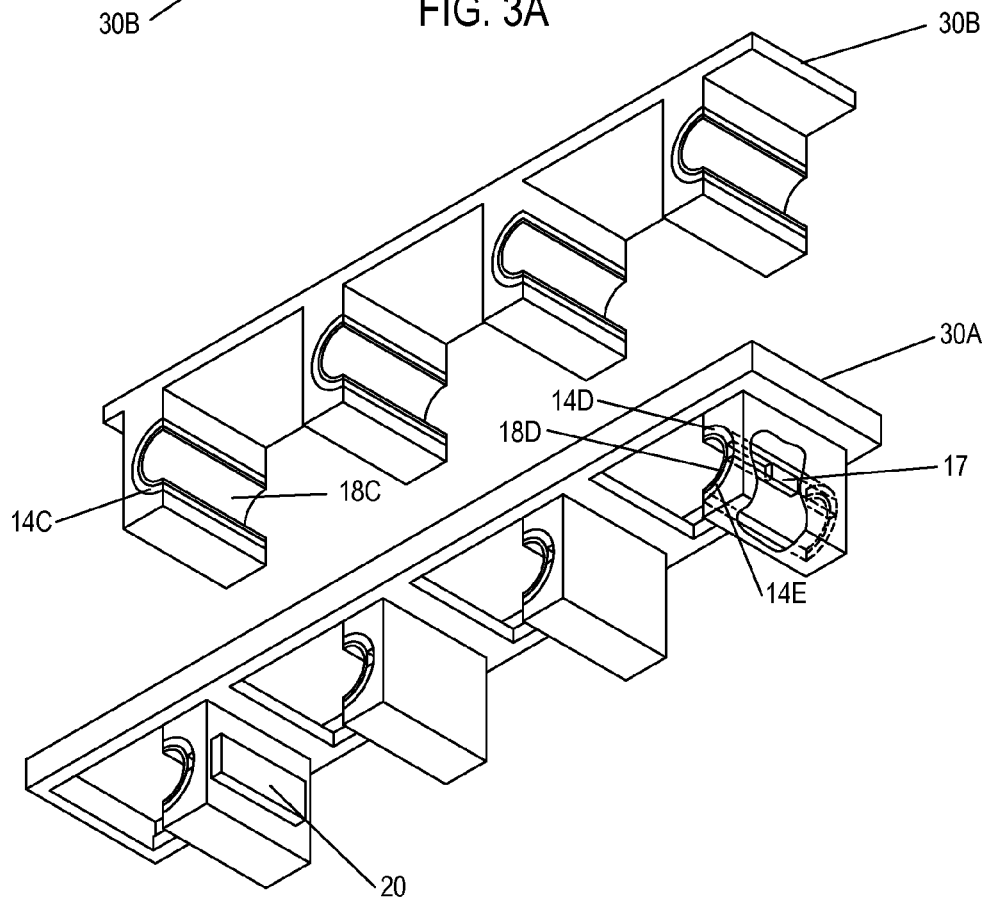
FIG. 3B is an exploded isometric view, of a multi-branch current-sensing device in accordance with another embodiment of the present invention.

Referring to FIG. 3A and FIG. 3B, an alternative form of current-sensing device is shown that can provide for facile and temporary installation from the face of a power distribution panel without requiring insertion of a frame member behind the branch circuit wires. The current-sensing device of FIG. 3A and FIG. 3B is similar to the current-sensing device of FIGS. 1A-1B, so only differences between the current-sensing devices will be described below. The current-sensing device of FIG. 3A and FIG. 3B forms a unitary assembly with frame member 30A inserted within frame member 30B to provide a sliding action that, in an open position, provides gaps between the extensions of frame member 30A and 30B in which ferrite cylinder portions 14C, 14D and 14E and current sensors 17 are integrated. A spring or other suitable restoring force element can be included within frame member 30A to push the extensions of frame member 30B against the extensions of frame member 30A to bring ferrite cylinder portions 14C, 14D and 14E into contact in the closed position around multiple branch circuit wires. In the open position, which can be maintained by using a finger or tool to move frame member 30B with respect to frame member 30A, or which alternatively may be maintained using a locking detent or other locking mechanism (not shown) between frame members 30A and 30B. The extensions of frame members 30A and 30B are separated to permit insertion of the current-sensing device over the multiple branch circuit wires. Voltage-sensing elements in the form of metal foils or layers 18C and 18D are also integrated within frame members 30A and 30B.

Figure 4A:
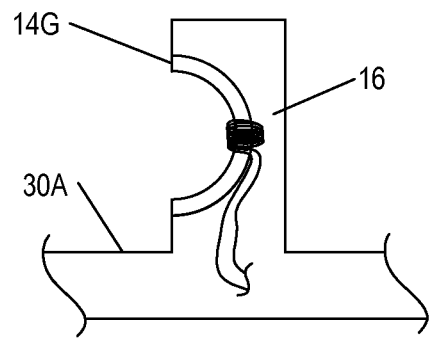
FIGS. 4A-4B are illustrations showing details of current-sensing elements that can be used in the multi-branch current sensor of FIGS. 3A-3B.
Figure 4B:
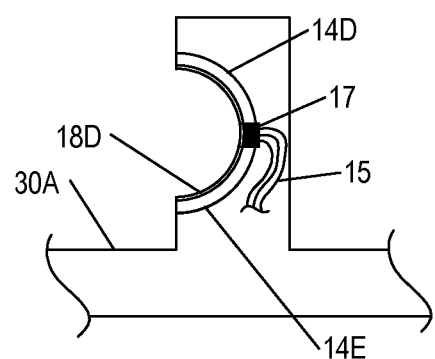

Referring now to FIG. 4A, an alternative current-sensing device similar to the current sensor of FIG. 2B is shown. Winding 16 is disposed around the extension of frame member 30A and around ferrite cylinder portion 14G, the connections of winding 16 are integrated within Frame member 30A and routed to integrated circuit assembly 20. FIG. 4B shows details of the current-sensing device including current sensor 17 as illustrated in FIGS. 3A-3B and as described above with reference to FIGS. 3A-3B.

Figure 5:
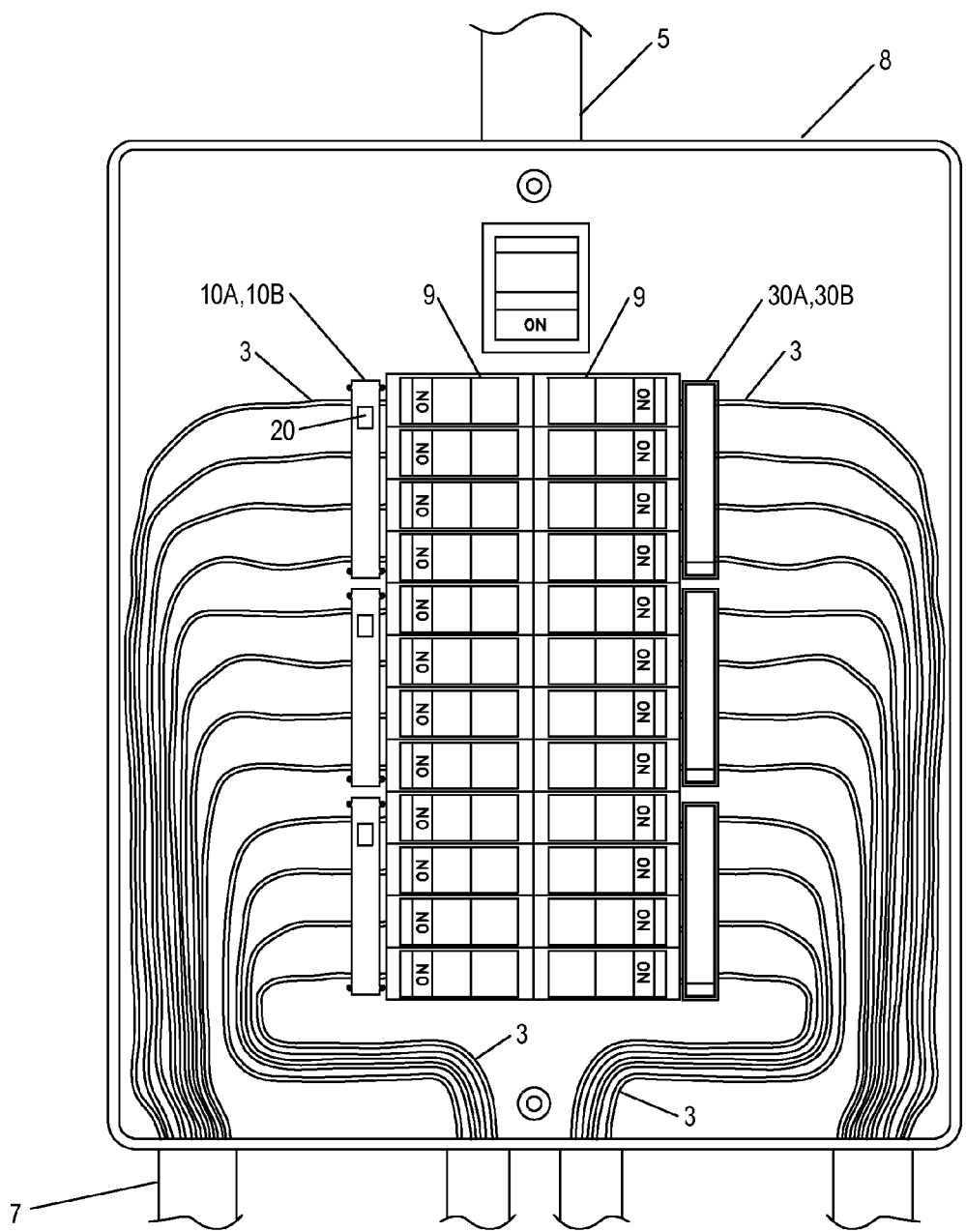
FIG. 5 is a pictorial diagram showing current-sensing devices according to embodiments of the present invention installed in an electrical power distribution system.

Referring now to FIG. 5, a power distribution system in accordance with an embodiment of the present invention is shown. A power distribution panel 8 receives service entrance wiring 5 and distributes power to branch circuit wires 3 via circuit breakers 9. Branch circuit wires 3 are routed to supply power to loads via conduits or other raceways 7. For the purposes of illustration, within power distribution panel 8, current-sensing devices housed by frame members 10A,10B as illustrated in FIGS. 1A and 1B are installed on the left side branch circuits, and current-sensing devices housed by frame members 30A,30B as illustrated in FIGS. 3A and 3B are installed on the right side branch circuits.

Figure 6:
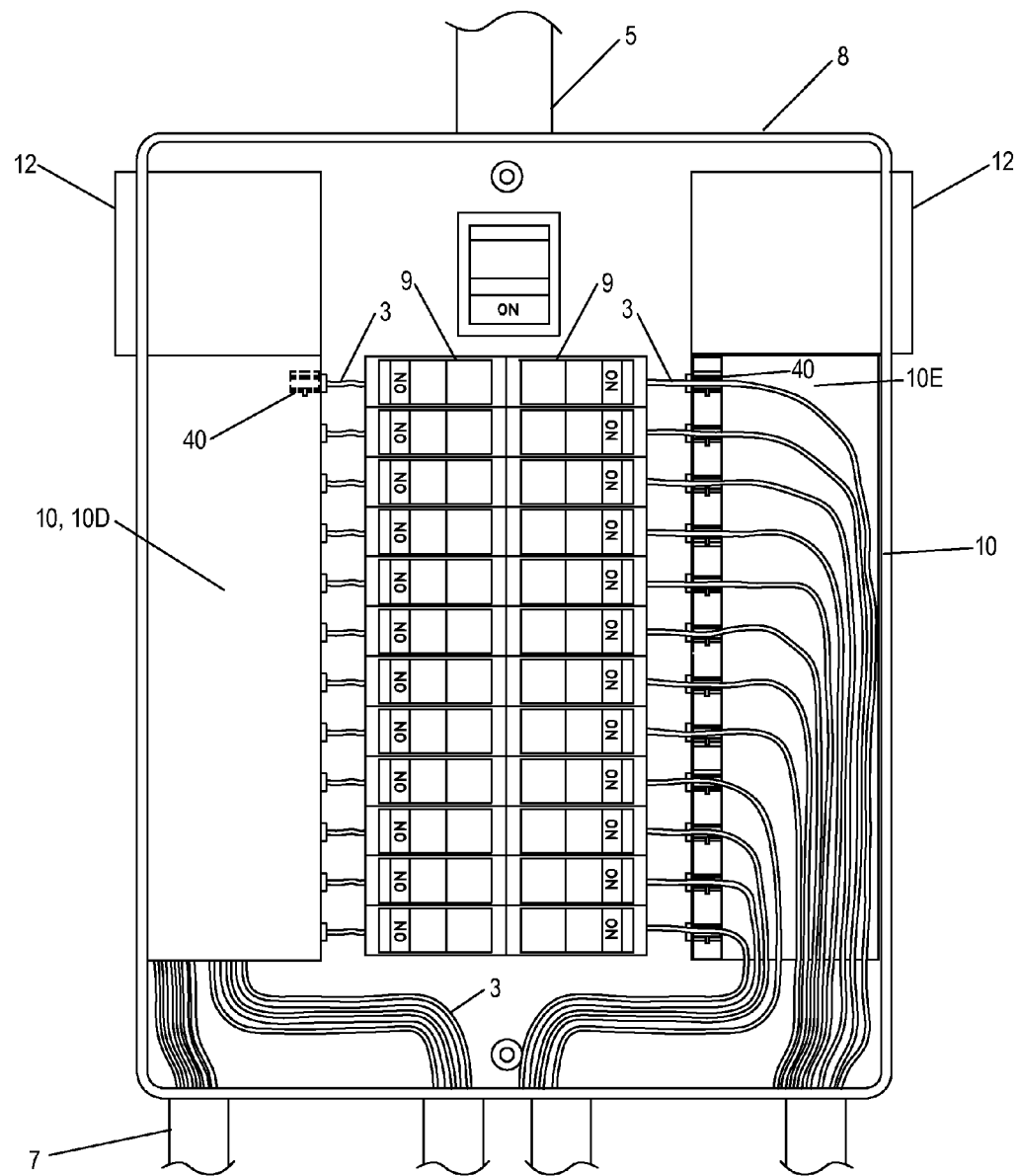
FIG. 6 is a pictorial diagram showing wire managers 10 according to the present invention installed in an electrical power distribution system.

Referring now to FIG. 6, a wire manager in accordance with an embodiment of the present invention is shown installed in a power distribution system. A power distribution panel 8 receives service entrance wiring 5 and distributes power to branch circuit wires 3 via circuit breakers 9. Branch circuit wires 3 are routed to supply power to loads via conduits or other raceways 7. Within power distribution panel 8, wire managers 10, in accordance with an embodiment of the invention, are installed. Wire managers 10 include a cover portion 10D and a base portion 10E. Wire managers 10 control the position of branch circuit wires 3 and further include sensing elements 40 that are used to determine the current flowing through branch circuit wires 3 and optionally the magnitude and/or phase of the voltage on branch circuit wires 3 to provide for computation of the actual (complex) power delivered to the branch circuit loads. Sensing elements 40 have a split-core construction similar or identical to the sensors incorporated within the sensing device illustrated in FIG. 1A-1B, with the portion including current-sensing element 17 embedded within base portion 10E and the other split cores that complete the magnetic paths with the bottom portion of sensors 40 integrated at a corresponding position on the bottom side of cover portion 10D. Wire managers 10 also include an interface/processing unit 12 that provides a wired or wireless interface to an external processing system and generally provides for computation of power usage-related information prior to transmission to the external processing system, although raw current (and optionally voltage) sensor output information could alternatively be transmitted, with computation of power usage-related information performed in the external processing system. Interface/processing unit 12 may alternatively be placed in locations and be dimensioned other than as shown. For example, interface/processing unit 12 may be physically separate from wire manager 10 and be coupled to wire manager 10 by a wired, wireless, optical or other suitable interface.

Figure 7A:
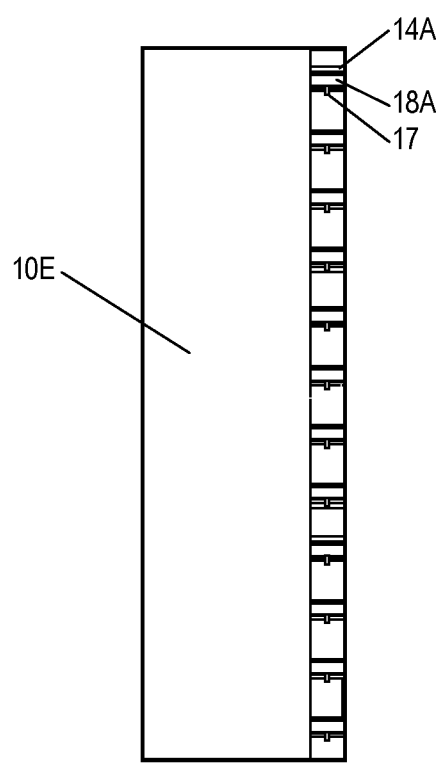
FIG. 7A is a top view of base portion 10E and FIG. 7B is a side view of cover portion 10D of wire managers 10 of FIG. 6.
Figure 7B:
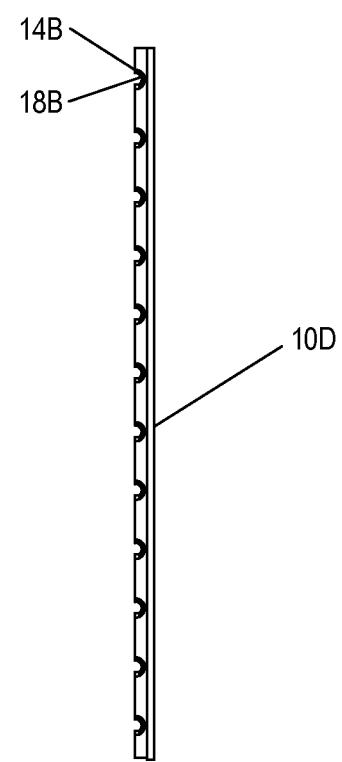

Referring now to FIG. 7A, details of base portion 10E of wire manager 10 of FIG. 6 are shown, in accordance with an embodiment of the invention. Base portion 10E includes the ferrite cylinder portion 14A, current-sensing element 17 and optional voltage-sensing element 18A identical to those elements in FIGS. 1A-1B. Connections to current-sensing elements 17 are not shown for clarity, but are generally embedded within base portion 10E and extend to measurement circuits within interface/processing unit 12 of FIG. 6. Referring now to FIG. 7B, details of cover portion 10D of wire manager 10 of FIG. 6 are shown, in accordance with an embodiment of the invention. Cover portion 10D includes ferrite cylinder portion 14B which completes the magnetic pathway around ferrite cylinder portion 14A when cover portion 10D is installed over base portion 10E. Similarly, cover portion 10D may include voltage-sensing element 18B integrated within ferrite cylinder portion 14B.

Figure 8:
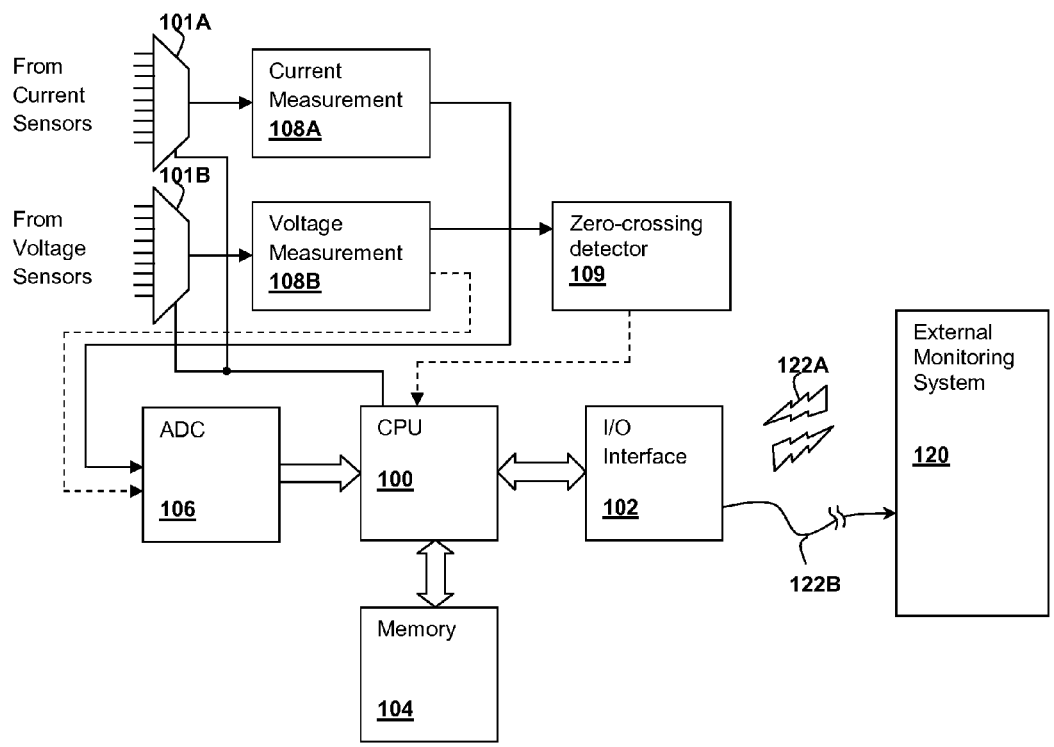
FIG. 8 is an electrical block diagram illustrating circuits that can be interfaced to, and optionally incorporated within, the multi-branch current sensors of FIGS. 1A-1B and FIGS. 3A-3B, according to an embodiment of the present invention.

Referring now to FIG. 8, details of integrated circuit assembly 20 as illustrated in FIG. 1B and FIG. 3B, and which are generally included in interface/processing unit 12 of FIG. 6, is shown. A multiplexer 101A receives signals from the individual current sensors 17 (or windings 16) and selects a sensor for measurement, providing input to a current measurement circuit 108A, which is an analog circuit that appropriately scales and filters the current sensor output. The output of current measurement circuit 108A is provided as an input to an analog-to-digital converter (ADC) 106, which converts the current output waveform generated by current measurement circuit 108A to sampled values provided to a central processing unit (CPU) 100 that performs power calculations in accordance with program instruction stored in a memory 104 coupled to CPU 100. Alternatively, a separate current measurement circuit 108A and multiplexer 101A may not be necessary, and sensors 17 or windings 16 may be coupled directly to ADC 106. The power usage by the branch circuit associated with a particular sensor can be determined by assuming that the branch circuit voltage is constant (e.g., 115Vrms) and that the phase relationship between the voltage and current is aligned (i.e., in-phase). However, while the assumption of constant voltage is generally sufficient, as properly designed distribution systems do not let the line voltage sag more than a small amount, e.g., <3%, the phase relationship between voltage and current is dependent on the power factor of the load, and can vary widely and dynamically by load and over time. Therefore, it is generally desirable to at least know the phase relationship between the branch circuit voltage and current in order to accurately determine power usage by the branch circuit.

When voltage measurement is implemented, another multiplexer 101B is provided to receive signals from the individual voltage-sensing elements, e.g., one of voltage-sensing elements 18A, 18B or 18C, 18D in the above-described current-sensing devices, if voltage-sensing is also implemented. Multiplexer 101B receives signals from the individual voltage-sensing elements within the devices and selects a sensor for measurement, providing input to a voltage measurement circuit 108B, which is an analog circuit that appropriately scales and filters the signal received from voltage-sensing elements 18A, 18B or 18C, 18D. A zero-crossing detector 109 may be used to provide phase-only information to a central processing unit 100 that performs power calculations, alternatively or in combination with providing an output of voltage measurement circuit to an input of ADC 106. Alternatively, multiplexor 101B may not be necessary and one or more voltage sensor outputs of sensors 17 (or windings 16) may be connected directly to ADC 106. In particular, it may not be necessary to make voltage measurements at each of sensors 17, for example, when sensing the phase of the voltage, a single measurement may suffice for providing a phase reference that is then used to determine the voltage-to-current phase difference for multiple branch circuits. Further, if multiple voltage measurements are taken, the voltage measurements may be used as an absolute voltage measurement, or the amplitude may be scaled to a known peak, r.m.s. or average value. An input/output (I/O) interface 102 provides either a wireless or wired connection to an external monitoring system 120, such as a wireless local area network (WLAN) connection 122A or wired Ethernet connection 122B. When power factor is not taken into account, the instantaneous power used by each branch circuit can be approximated as:

$$P_{BRANCH} = V_{rms} * I_{meas}$$

where $V_{rms}$ is a constant value, e.g. 115V and $I_{meas}$ is a measured rms current value. Power value $P_{BRANCH}$ may be integrated over time to yield the energy use. When the phase of the voltage is known, then the power may be computed more accurately as:

$$P_{BRANCH} = V_{rms} * I_{meas} * \cos(\Phi)$$

where $\Phi$ is a difference in phase angle between the voltage and current waveforms. The output of zero-crossing detector 109 may be compared with the position of the zero crossings in the current waveform generated by current measurement circuit 108A and the time $\Delta T$ between the zero crossings in the current and voltage used to generate phase difference $\Phi$ from the line frequency (assuming the line frequency is 60 Hz):

$$\Phi = 2\Pi * 60 * \Delta T$$

In general, the current waveform is not truly sinusoidal and the above approximation may not yield sufficiently accurate results. A more accurate method is to multiply current and voltage samples measured at a sampling rate much higher than the line frequency. The sampled values thus approximate instantaneous values of the current and voltage waveforms and the energy may be computed as:

$$\Sigma(V_n * I_n)$$

A variety of arithmetic methods may be used to determine power, energy and phase relationships from the sampled current and voltage measurements.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A current-sensing device for measuring individual currents passing through multiple wires corresponding to multiple branch circuits, the current-sensing device comprising:
   a first frame member having a base portion and a first set of extensions securing corresponding ones of a first set of ferrite cylinder portions disposed along a length of the first frame member and corresponding to the multiple branch circuit wires;
   a second frame member having a cover portion and a second set of extensions securing corresponding ones of a second set of ferrite cylinder portions along a length of the second frame member and corresponding to the first set of ferrite cylinder portions, such that when the cover portion of the second frame member is fastened over the base portion of the first frame member, the first set of extensions extend through voids formed through the cover portion of the second frame member, wherein the length of the voids along the length of the second frame member is greater than a width of the extensions along the length of the first frame member portion so that the first frame member is slideably coupled to the second frame member to provide movement between a closed position in which the first set of multiple ferrite cylinder portions are located proximate to or contacting corresponding ones of the second set of multiple ferrite cylinder portions to form substantially closed magnetic flux loops surrounding the corresponding wires of the multiple branch circuits and an open position in which the first set of multiple ferrite cylinder portions are displaced from the corresponding ones of the second set of multiple ferrite cylinder portions so gaps are formed therebetween for passage of the corresponding wires without disconnecting an end of the corresponding wires; and
   multiple current sensors coupled to the corresponding magnetic flux loops formed by the first and second sets of multiple ferrite cylinder portions.

2. The current-sensing device of claim 1, wherein the multiple current sensors comprise multiple semiconductor current sensors located within gaps formed in the corresponding magnetic flux loops formed by the first and second sets of multiple ferrite cylinder portions.

3. The current-sensing device of claim 1, wherein the multiple current sensors comprise multiple coils, each wound around a corresponding one of the first set of multiple ferrite cylinder portions.

4. The current-sensing device of claim 1, wherein the first and second sets of ferrite cylinder portions are positioned by the first frame member and the second frame member, respectively, such that cylindrical voids defined between each of the first set of ferrite cylinder portions and corresponding ones of the second ferrite cylinder portions are parallel and spaced appropriately for receiving multiple branch circuits emanating from standard circuit breakers spaced at intervals of one-half inch, one inch or two inches.

5. The current-sensing device of claim 1, further comprising multiple voltage-sensing elements for sensing electrical potentials at corresponding ones of the multiple wires.

6. The current-sensing device of claim 5, wherein the multiple voltage-sensing elements comprise a film affixed to or deposited within corresponding ones of at least one of the first set of ferrite cylinder portions or the second ferrite cylinder portions.

7. The current-sensing device of claim 1, further comprising a processing circuit integrated within the first frame member for measuring outputs of the multiple current sensors and providing information determined from the multiple current sensors to an external system via an interface.

8. The current-sensing device of claim 7, wherein the interface is a wireless interface integrated within the first frame member.

9. A method of measuring currents passing through multiple wires corresponding to multiple branch circuits, the method comprising:
   securing a current-sensing device around the multiple wires, wherein the current-sensing device includes multiple current sensors coupled to corresponding magnetic flux loops formed by first and second sets of ferrite cylinder portions that are integrated within a corresponding first frame member and a second frame member, respectively, wherein the first frame member has a base portion and a first set of extensions securing corresponding ones of a first set of ferrite cylinder portions disposed along a length of the first frame member and corresponding to the multiple branch circuit wires, wherein the second frame member has a cover portion and a second set of extensions securing corresponding ones of a second set of ferrite cylinder portions along a length of the second frame member and corresponding to the first set of ferrite cylinder portions, and wherein the cover portion of the second frame member is fastened over the base portion of the first frame member so that the first set of extensions extend through voids formed through the cover portion of the second frame member, wherein the length of the voids along the length of the second frame member is greater than a width of the extensions along the length of the first frame member portion so that the first frame member is slideably coupled to the second frame member so that the securing provides movement between a closed position so that the first set of multiple ferrite cylinder portions are located proximate to or contacting corresponding ones of the second set of multiple ferrite cylinder portions to form the magnetic flux loops to surround the corresponding wires of the multiple branch circuits, and an open position in which the first set of multiple ferrite cylinder portions are displaced from the corresponding ones of the second set of multiple ferrite cylinder portions so gaps are formed therebetween for passage of the corresponding wires without disconnecting an end of the corresponding wires; and
   measuring the currents by measuring an output of the current sensors.

10. The method of claim 9, further comprising sensing electric potentials at the wires using a voltage-sensing element integrated in at least one of the first or the second frame members.

11. The method of claim 9, further comprising installing the current-sensing device in a building power distribution panel or raceway, wherein the multiple branch circuits are multiple branch circuits of the building, and wherein the measuring measures the current consumed by multiple loads supplied by the multiple branch circuits.

12. The method of claim 9, further comprising transmitting a result of the measuring to an external system from an interface integrated with the first frame member.

13. A current-sensing device for measuring individual currents passing through multiple wires corresponding to multiple branch circuits, the current-sensing device comprising:
   comprising:

a first frame member having a base portion and a first set of extensions securing corresponding ones of a first set of ferrite cylinder portions disposed along a length of the first frame member and corresponding to the multiple branch circuit wires;

a second frame member having a cover portion and a second set of extensions securing corresponding ones of a second set of ferrite cylinder portions along a length of the second frame member and corresponding to the first set of ferrite cylinder portions, such that when the cover portion of the second frame member is fastened over the base portion of the first frame member, the first set of extensions extend through voids formed through the cover portion of the second frame member, wherein the length of the voids along the length of the second frame member is greater than a width of the extensions along the length of the first frame member portion so that the first frame member is slideably coupled to the second frame member to provide movement between a closed position in which the first set of multiple ferrite cylinder portions are located proximate to or contacting corresponding ones of the second set of multiple ferrite cylinder portions to form substantially closed magnetic flux loops surrounding the corresponding wires of the multiple branch circuits and an open position in which the first set of multiple ferrite cylinder portions are displaced from the corresponding ones of the second set of multiple ferrite cylinder portions so gaps are formed therebetween for passage of the corresponding wires without disconnecting an end of the corresponding wires, wherein the first and second sets of ferrite cylinder portions are positioned by the first frame member and the second frame member, respectively, such that cylindrical voids defined between each of the first set of ferrite cylinder portions and corresponding ones of the second ferrite cylinder portions are parallel and spaced appropriately for receiving multiple branch circuits emanating from standard circuit breakers spaced at intervals of one-half inch, one inch or two inches;

multiple semiconductor current sensors coupled to the corresponding magnetic flux loops formed by the first and second sets of multiple ferrite cylinder portions;

multiple voltage-sensing elements comprising a film affixed to or deposited within corresponding ones of at least one of the first set of ferrite cylinder portions or the second ferrite cylinder portions for sensing electrical potentials at corresponding ones of the multiple wires; and a processing circuit integrated within the first frame member for measuring outputs of the multiple current sensors and providing information determined from the multiple current sensors to an external system via an interface.

* * * * *